(12) United States Patent
Mitsuyama et al.

(10) Patent No.: US 10,396,407 B2
(45) Date of Patent: Aug. 27, 2019

(54) SECONDARY BATTERY INTERNAL TEMPERATURE ESTIMATION DEVICE AND SECONDARY BATTERY INTERNAL TEMPERATURE ESTIMATION METHOD

(71) Applicants: FURUKAWA ELECTRIC CO., LTD., Tokyo (JP); Furukawa Automotive Systems Inc., Shiga (JP)

(72) Inventors: Taiji Mitsuyama, Tokyo (JP); Noriyasu Iwane, Tokyo (JP); Naoya Takashima, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 24 days.

(21) Appl. No.: 15/268,512

(22) Filed: Sep. 16, 2016

(65) Prior Publication Data

US 2017/0012327 A1 Jan. 12, 2017

Related U.S. Application Data (63) Continuation of application No. PCT/JP2015/057483, filed on Mar. 13, 2015.

(30) Foreign Application Priority Data

Mar. 20, 2014 (JP) .................... 2014-059252

(51) Int. Cl.
*G01K 7/42* (2006.01)
*G01R 31/36* (2019.01)
(Continued)

(52) U.S. Cl.
CPC ............ *H01M 10/486* (2013.01); *G01K 7/42* (2013.01); *G01R 31/3648* (2013.01);
(Continued)

(58) Field of Classification Search
CPC .................... H01M 10/486; G01R 31/3675
See application file for complete search history.

(56) References Cited

U.S. PATENT DOCUMENTS

2007/0120537 A1\* 5/2007 Yamamoto ......... G01R 31/3679
320/150
2012/0021263 A1\* 1/2012 Nishi .................. B60L 11/1851
429/62
(Continued)

FOREIGN PATENT DOCUMENTS

JP 2001076769 A 3/2001
JP 2006-101674 * 4/2006
(Continued)

OTHER PUBLICATIONS

Di Filippi, et al. "Model-based life estimation of Li-ion batteries in PHEVs using large scale vehicle simulations: An introductory study" Vehicle Power and Propulsion Conference (VPPC), 2010 IEEE, Sep. 1, 2010, IEEE—ISBN 978-1-4244-8220-7 ; ISBN 1-4244-8220-8, 6 pages.
(Continued)

*Primary Examiner* — Michael J Dalbo
(74) *Attorney, Agent, or Firm* — Amin, Turocy & Watson, LLP (57) ABSTRACT

A secondary battery internal temperature estimation device that estimates a secondary battery's internal temperature regardless of the secondary battery's type or state of degradation, the device including: a control unit that estimates the secondary battery's internal temperature on the basis of a relational equation showing a relationship between an external temperature and the secondary battery's internal temperature. A control unit calculates element values of an equivalent circuit of the secondary battery, determines a coefficient of the relational equation on the basis of the element values of the equivalent circuit calculated by the
(Continued)

control unit, and applies the coefficient obtained by the control unit to the relational equation. The control unit estimates the secondary battery's internal temperature on the basis of the relational equation to which the coefficient has been applied by the control unit.

20 Claims, 4 Drawing Sheets

(51) Int. Cl.
*H01M 10/48* (2006.01)
*G01R 31/389* (2019.01)
*G01R 31/396* (2019.01)

(52) U.S. Cl.
CPC ......... *G01R 31/389* (2019.01); *G01R 31/396* (2019.01); *G01K 2007/422* (2013.01); *H01M 2220/20* (2013.01)

(56) References Cited

U.S. PATENT DOCUMENTS

| | | | | |
|---|---|---|---|---|
| 2012/0256569 | A1* | 10/2012 | Kawahara | H01M 10/486 318/139 |
| 2013/0110429 | A1* | 5/2013 | Mitsuyama | H01M 10/48 702/63 |
| 2013/0156072 | A1* | 6/2013 | Hebiguchi | H01M 10/48 374/183 |
| 2014/0095092 | A1 | 4/2014 | Ikeda et al. | |

FOREIGN PATENT DOCUMENTS

| | | |
|---|---|---|
| JP | 2008249459 A | 10/2008 |
| JP | 2012192811 A | 10/2012 |
| JP | 2014070982 A | 4/2014 |

OTHER PUBLICATIONS

Pilatowicz, et al. "Simulation of SLI Lead-Acid Batteries for SoC, Aging and Cranking Capability Prediction in Automotive Applications", Journal of the Electrochemical Society, 159(9), The Electrochemical Society, Aug. 14, 2012, 22 pages.

Prada, et al. "Simplified Electrochemical and Thermal Model of LiFePO4-Graphite Li-ion Batteries for Fast Charge Applications", Journal of the Electrochemical Society, 159(9), The Electrochemical Society, Aug. 14, 2012, 44 pages.

International Search Report for PCT Application No. PCT/JP2015/057483 dated Apr. 28, 2015, 4 pages.

* cited by examiner

SECONDARY BATTERY INTERNAL TEMPERATURE ESTIMATION DEVICE AND SECONDARY BATTERY INTERNAL TEMPERATURE ESTIMATION METHOD

CROSS-REFERENCE TO RELATED APPLICATIONS

The subject application is a continuation of, and claims priority to, PCT Application Serial No. PCT/JP2015/057483, filed Mar. 13, 2015, and entitled "SECONDARY BATTERY INTERNAL TEMPERATURE ESTIMATION DEVICE AND SECONDARY BATTERY INTERNAL TEMPERATURE ESTIMATION METHOD", which claims priority to Japanese Patent Application Serial No. 2014-059252, filed Mar. 20, 2014, the disclosures of which are incorporated herein by reference in their entirety.

TECHNICAL FIELD

The present invention relates to a secondary battery internal temperature estimation device and a secondary battery internal temperature estimation method.

BACKGROUND ART

For example, characteristics of secondary batteries such as lead-acid batteries vary with the temperature of the electrolytic solution, the electrode plates, and the like, that is, the internal temperature. As such, there is a need to accurately find the internal temperature in order to accurately detect a state of the secondary battery. Particularly, for a secondary battery installed in a vehicle, the internal temperature changes significantly due to the heat generated by the engine and the like. Therefore, detection of the internal temperature is essential to accurately detect the state of the secondary battery.

Conventionally, techniques such as those described, for example, in Patent Document 1 and Patent Document 2 have been used as techniques for finding the internal temperature of a secondary battery.

CITATION LIST

Patent Documents

Patent Document 1: Japanese Unexamined Patent Application Publication No. 2001-076769
Patent Document 2: Japanese Unexamined Patent Application Publication No. 2008-249459

SUMMARY OF INVENTION

Technical Problem

However, with the techniques described in Patent Documents 1 and 2, the secondary batteries for which the internal temperature is to be estimated are presumed to be of the same type of secondary battery and, for example, in cases where a user replaces a secondary battery with a different type of secondary battery, there is a problem in that the internal temperature cannot be accurately estimated. Additionally, while temperature characteristics of secondary batteries change with degradation and the like, Patent Documents 1 and 2 do not take degradation and the like of the secondary battery into consideration and, as such, there is a problem in that, depending on the state of degradation, an accurate temperature cannot be estimated.

An object of the present invention is to provide a secondary battery internal temperature estimation device and a secondary battery internal temperature estimating method that enable the estimation of the accurate internal temperature of a secondary battery, regardless of the type or state of degradation of the secondary battery.

Solution to Problem

To solve the problems described above, a secondary battery internal temperature estimation device that estimates an internal temperature of a secondary battery includes: an estimation means that estimates an internal temperature of a secondary battery on the basis of a relational equation showing a relationship between an external temperature and the internal temperature of the secondary battery; a calculation means that calculates element values of an equivalent circuit of the secondary battery; a determination means that determines a coefficient of the relational equation on the basis of the element values of the equivalent circuit calculated by the calculation means; and an application means that applies the coefficient obtained by the determination means to the relational equation; wherein the estimation means estimates the internal temperature of the secondary battery on the basis of the relational equation to which the coefficient has been applied by the application means.

According to this configuration, an accurate internal temperature of a secondary battery can be estimated, regardless of the type and state of degradation of the secondary battery.

Additionally, in the present invention, the equivalent circuit of the secondary battery comprises a solution resistance, a reaction resistance, and an electric double layer capacity; and the determination means determines the coefficient of the relational equation on the basis of one or a plurality of element values of the solution resistance, the reaction resistance, and the electric double layer capacity.

According to this configuration, an equivalent circuit that includes a plurality of elements is used and, as a result, the internal temperature can be accurately found.

Additionally, in the present invention, the determination means determines the coefficient of the relational equation by referencing a dischargeable capacity of the secondary battery in a state of full charge.

According to this configuration, the dischargeable capacity is referenced and, as a result, the internal temperature can be more accurately found.

Additionally, the present invention further includes a correction means that corrects the element values calculated by the calculation means to values at a reference state of charge and at a reference temperature.

According to this configuration, the element values are found more accurately by correcting them to a reference state and, as a result, the internal temperature can be found even more accurately.

Additionally, in the present invention, the estimation means estimates the internal temperature of the secondary battery by using a transfer function of a first-order lag system as the relational equation.

According to this configuration, the internal temperature can be accurately found using a simple equation.

Additionally, in the present invention, the determination means determines an integral gain of the transfer function of the first-order lag system on the basis of the element values of the equivalent circuit.

According to this configuration, the number of coefficients to be calculated is reduced and, as a result, processing can be streamlined.

Additionally, in the present invention, the calculation means calculates the element values of the equivalent circuit on the basis of a voltage and a current during discharge of the secondary battery.

According to this configuration, the element values can be simply and accurately calculated on the basis of the voltage and the current during discharge.

Additionally, a secondary battery internal temperature estimation method for estimating an internal temperature of a secondary battery includes: an estimation step of estimating an internal temperature of a secondary battery on the basis of a relational equation showing a relationship between an external temperature and the internal temperature of the secondary battery; a calculation step of calculating element values of an equivalent circuit of the secondary battery; a determination step of determining a coefficient of the relational equation on the basis of the element values of the equivalent circuit calculated in the calculation step; and an application step of applying the coefficient obtained in the determination step to the relational equation; wherein in the estimation step, the internal temperature of the secondary battery is estimated on the basis of the relational equation to which the coefficient has been applied in the application step.

According to this method, an accurate internal temperature of a secondary battery can be estimated, regardless of the type and state of degradation of the secondary battery.

Advantageous Effects of Invention

According to the present invention, a secondary battery internal temperature estimation device and a secondary battery internal temperature estimation method can be provided that enable the estimation of the accurate internal temperature of a secondary battery, regardless of the type or state of degradation of the secondary battery.

DESCRIPTION OF EMBODIMENTS

Embodiments of the present invention will be described below.

(A) Explanation of Configuration of the First Embodiment

Figure 1:
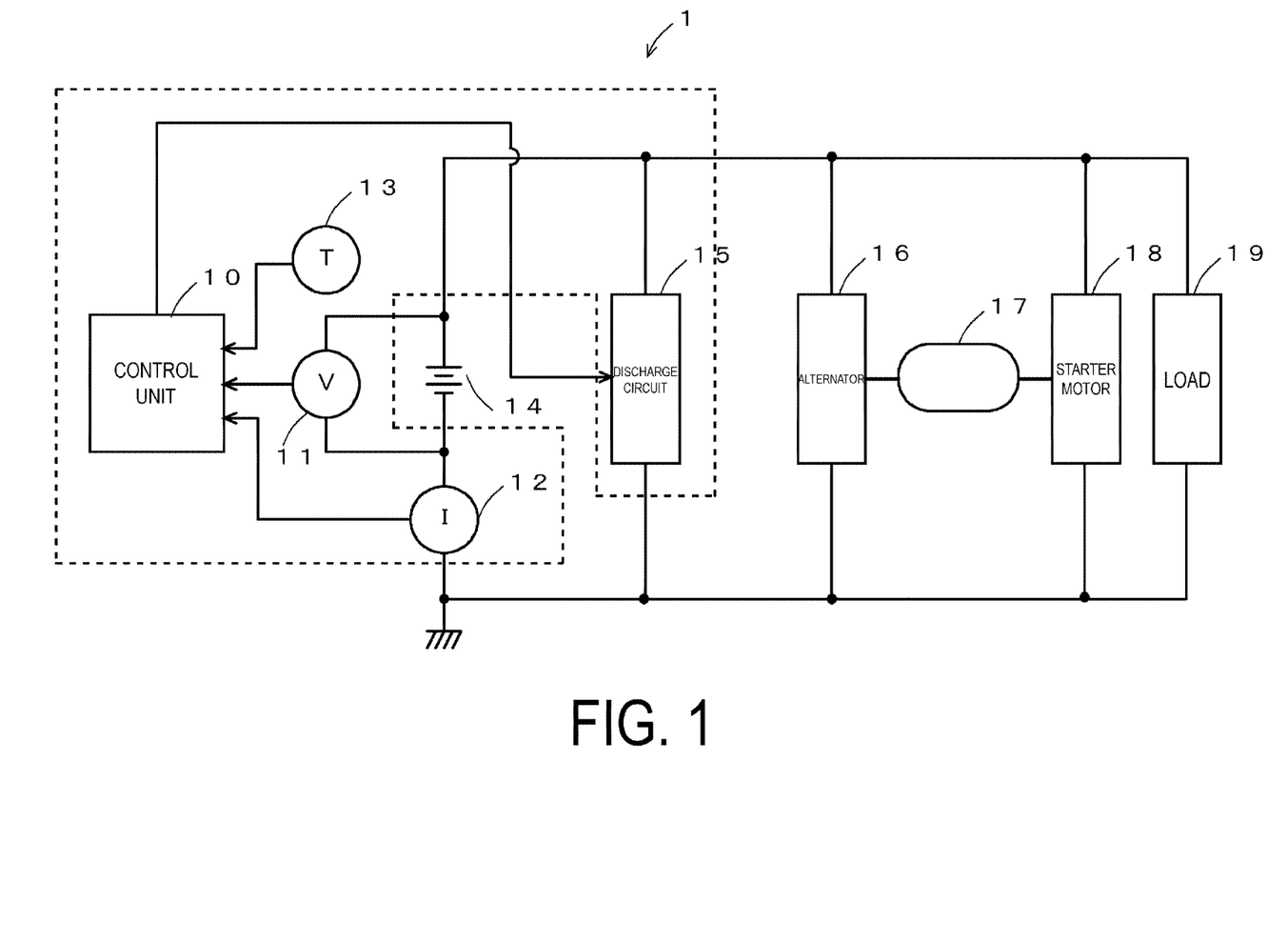
FIG. 1 is a drawing illustrating an example of a configuration of a secondary battery internal temperature estimation device according to an embodiment of the present invention.

FIG. 1 is a drawing illustrating a vehicle power supply system equipped with a secondary battery internal temperature estimation device according to a first embodiment of the present invention. In FIG. 1, the secondary battery internal temperature estimation device 1 basically includes a control unit 10, a voltage sensor 11, a current sensor 12, a temperature sensor 13, and a discharge circuit 15. The secondary battery internal temperature estimation device 1 is configured to estimate the internal temperature of a secondary battery 14 from an external temperature. Here, the control unit 10 estimates the internal temperature by calculating element values of an equivalent circuit of the secondary battery 14 while referencing output from the voltage sensor 11, the current sensor 12, and the temperature sensor 13; finding a coefficient of an equation by which temperature is estimated on the basis of the element values; and substituting the external temperature detected by the temperature sensor 13 into this equation. The voltage sensor 11 detects the terminal voltage of the secondary battery 14 and sends the result to the control unit 10. The current sensor 12 detects the current flowing to the secondary battery 14 and sends the result to the control unit 10. The temperature sensor 13 detects the external temperature of the secondary battery 14 itself or the ambient temperature therearound and sends the result to the control unit 10. The discharge circuit 15, which is constituted of, for example, a semiconductor switch, a resistance element, and the like connected in series, discharges the secondary battery 14 through on/off control of the semiconductor switch performed by the control unit 10. Note that, in the present specification, the term "external temperature" refers to the temperature of the environmental in which the secondary battery 14 is disposed, and the term "internal temperature" refers to the temperature inside the secondary battery 14 constituted of electrolytic solution and electrode plates.

The secondary battery 14, which is constituted of, for example, a lead-acid battery, a nickel-cadmium battery, a nickel-metal hydride battery, a lithium-ion battery, or the like, is charged by an alternator 16. In addition, the secondary battery 14 drives a starter motor 18 to start an engine and supplies electric power to a load 19. The alternator 16 is driven by the engine 17 to generate AC power that is converted to DC power by a rectifier circuit; the secondary battery 14 is then charged with the DC power.

The engine 17 is a reciprocating engine such as a petrol engine or a diesel engine, or a rotary engine, for example. The engine 17 is started by the starter motor 18 and drives drive wheels via a transmission to supply propulsive power to the vehicle. The engine 17 also drives the alternator 16 to generate electric power. The starter motor 18 is a DC motor, for example, and generates a rotational force using electric power supplied from the secondary battery 14 to start the engine 17. Examples of the load 19 include an electric power steering motor, a defogger, an ignition coil, a car audio system, and a car navigation system, and run on electric power from the secondary battery 14.

Figure 2:
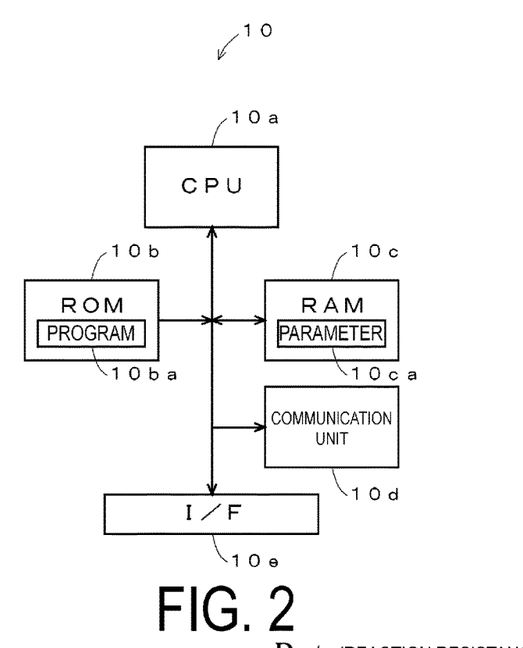
FIG. 2 is a block diagram illustrating a detailed example of a configuration of the control unit illustrated in FIG. 1.

FIG. 2 is a block diagram illustrating a detailed example of a configuration of the control unit 10 illustrated in FIG. 1. As illustrated in FIG. 2, the control unit 10 includes a central processing unit (CPU) 10a, a read-only memory (ROM) 10b, a random access memory (RAM) 10c, a communication unit 10d, and an interface (I/F) 10e. Here, the CPU 10a controls components according to a program 10ba stored in the ROM 10b. The ROM 10b, which is, for example, a semiconductor memory, stores the program 10ba and the like. The RAM 10c, which is, for example, a semiconductor memory, stores parameters 10ca such as data generated when the program ba is executed and tables and mathematical expressions described later. The communication unit 10d performs communication with a higher-level device, namely, an electronic control unit (ECU), and reports detected information to the higher-level device. The I/F 10e converts signals sent from the voltage sensor 11, the current sensor 12, and the temperature sensor 13 to digital signals and imports the resulting signals, and furthermore supplies a driving current to the discharge circuit 15 to control the discharge circuit 15.

(B) Explanation of Operation of the Embodiment

Next, the operation of the embodiment of the present invention will be described. In the embodiment of the present invention, for example, at a timing when input/output current to and from the secondary battery 14 is small such as when the vehicle is stopped, the CPU 10a of the control unit 10 references the output of the voltage sensor 11 and the current sensor 12, measures voltage Vb and current Ib of the secondary battery 14, and stores these measurement values as parameters 10ca in the RAM 10c.

Next, the CPU 10a controls the discharge circuit 15 to discharge the secondary battery 14 at a predetermined current (e.g. from a few amperes to a few dozen amperes). Note that this discharging is executed, for example, using a square wave or a step wave. Additionally, the discharging time can be set to, for example, from a few dozen milliseconds, to a few seconds.

When the discharging by the discharge circuit 15 begins, the CPU 10a samples the output from the voltage sensor 11 and the current sensor 12 at a predetermined period (e.g. a period of a few milliseconds to a few dozen milliseconds), and stores the sampled values as V(t) and I(t) in the RAM 10c as the parameters 10ca. Note that t represents time and is set to '0' at the timing when the sampling is begun; and is incremented with subsequent sampling. The CPU 10a substitutes the obtained V(t) and I(t) into Equation (1) below, calculates an impedance Z(t) of the secondary battery 14, and stores the impedance Z(t) in the RAM 10c as the parameter 10ca.

$$Z(t)=(Vb-V(t))/(Ib-I(t)) \quad (1)$$

Figure 3:
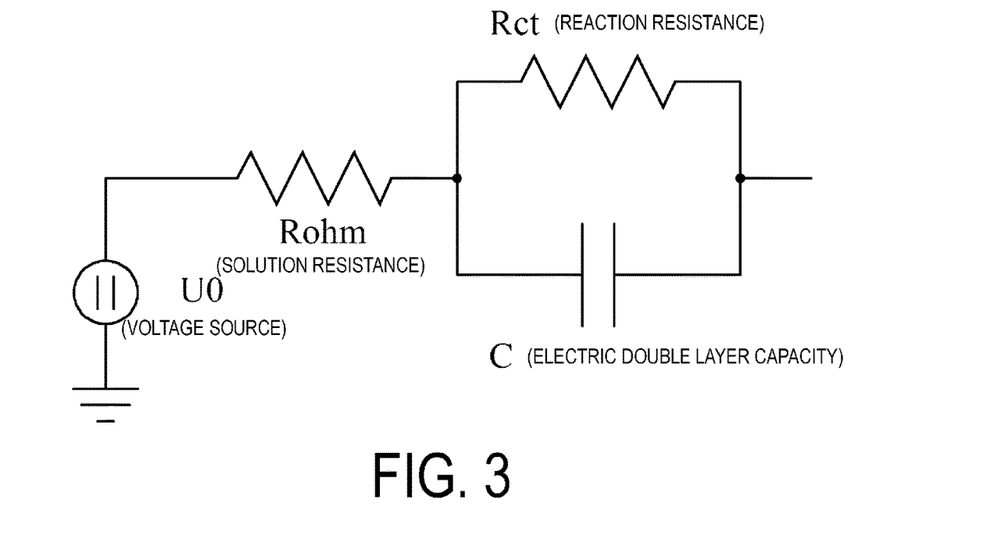
FIG. 3 is a drawing illustrating an example of an equivalent circuit of a secondary battery.

Additionally, on the basis of Equation (2) below, the CPU 10a uses the Z(t) obtained through the measurement and calculates the element values of the equivalent circuit, namely, Rohm, Rct, and C, using the least-square method or the like.

$$Z(t)=Rohm+Rct\times(1-\exp(-t/\tau)) \quad (2)$$

where, $\tau=C\times Rct$.

Next, the CPU 10a corrects the obtained Rohm, Rct, and C to a Rohm, Rct, and C at a reference state. Here, the reference state is a state where the state of charge (SOC) of the secondary battery 14 is 100% and the internal temperature Ti of the secondary battery 14 is 25° C. In cases where the SOC and the temperature deviate from the reference state, the element values are corrected so as to match the reference state.

Next, the CPU 10a substitutes the Rohm, Rct, and C that have been corrected to the reference state into Equation (3) below, and calculates an integral gain K2.

$$K2=A1\times Rohm+A2\times Rct+A3\times C \quad (3)$$

Here, coefficients A1 to A3 are for associating the element values of the equivalent circuit of the secondary battery 14 with the integral gain K2, and these values do not change with the type of the secondary battery 14, the type of a vehicle in which the secondary battery 14 is used, the environment in which the secondary battery 14 is used, or the like. These coefficients A1 to A3 may be measured in advance and stored in the ROM 10b.

Figure 4:
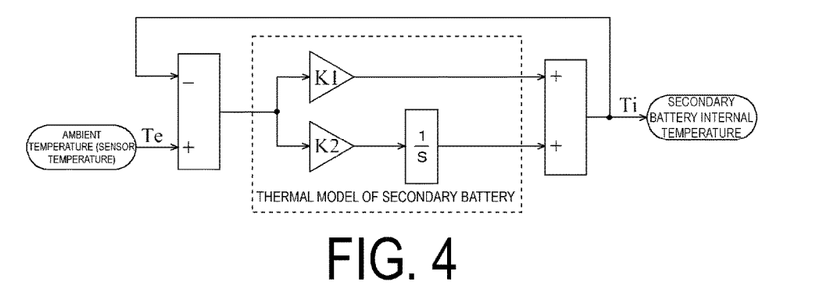
FIG. 4 is a drawing illustrating an example of a thermal model of a secondary battery.

Next, the CPU 10a applies the integral gain K2 calculated using the Equation (3) to a thermal model of the secondary battery 14 illustrated in FIG. 4. Here, FIG. 4 illustrates a thermal model of the secondary battery 14. In this example, a relationship between an external temperature Te of the secondary battery 14 and an internal temperature Ti of the secondary battery 14 is illustrated. In this model, the secondary battery 14 is modeled as a first-order lag system, and the transfer function T(S) between the external temperature Te and the internal temperature Ti is expressed by Equation (4) below. Note that a coefficient K1 is not easily influenced by the type, environment, or the like of the secondary battery 14; and a value calculated in advance for a desired secondary battery 14 can be used as the coefficient K1.

$$T(S)=Ti/Te=(K1+K2/S)/(1+K1+K2/S) \quad (4)$$

The CPU 10a applies the integral gain K2 calculated using the Equation (3) to a thermal model such as that described above. By using such a thermal model, the internal temperature Ti of the secondary battery 14 can be estimated from the external temperature Te of the secondary battery 14 detected by the temperature sensor 13. By using the internal temperature Ti thus calculated, temperature-dependent values, for example, the element values of the equivalent circuit and the state of function (SOF), can be accurately calculated and, as a result, the state of the secondary battery 14 can be detected with high accuracy.

Figure 5:
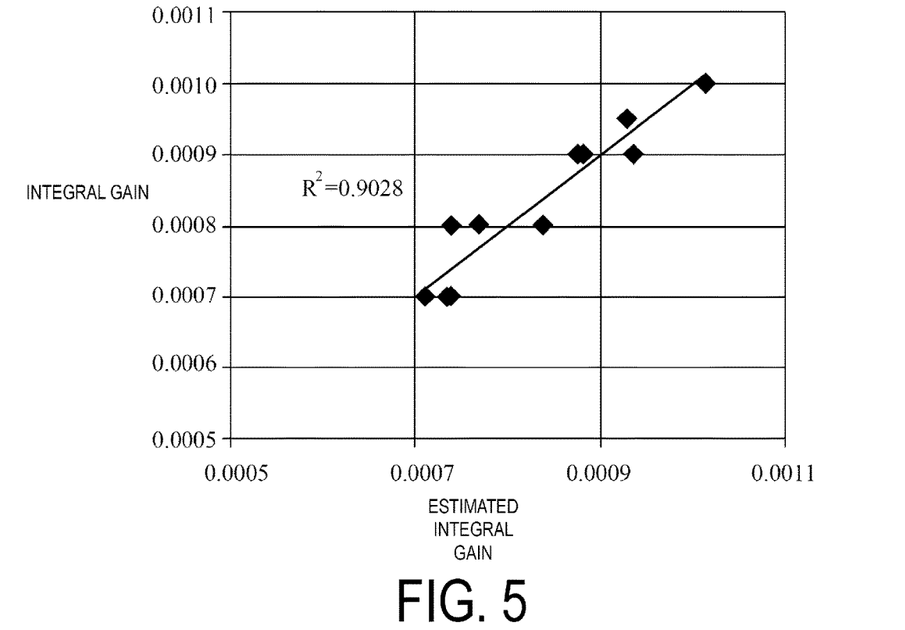
FIG. 5 is a graph showing a relationship between estimated results and actual measurement values.

FIG. 5 shows the results of comparing the integral gain K2 estimated according to the present embodiment described above and the integral gain K2 obtained through actual measurement. In FIG. 5, the integral gain estimated according to the embodiment of the present invention is shown on the horizontal axis and the results of actual measurement are shown on the vertical axis. FIG. 5 shows that the integral gain estimated according to the present embodiment matches the actual-measurement values with high accuracy, and that a determination coefficient $R^2$ is 0.9028, demonstrating the actual-measurement values match the estimated values with high accuracy.

Figure 6:
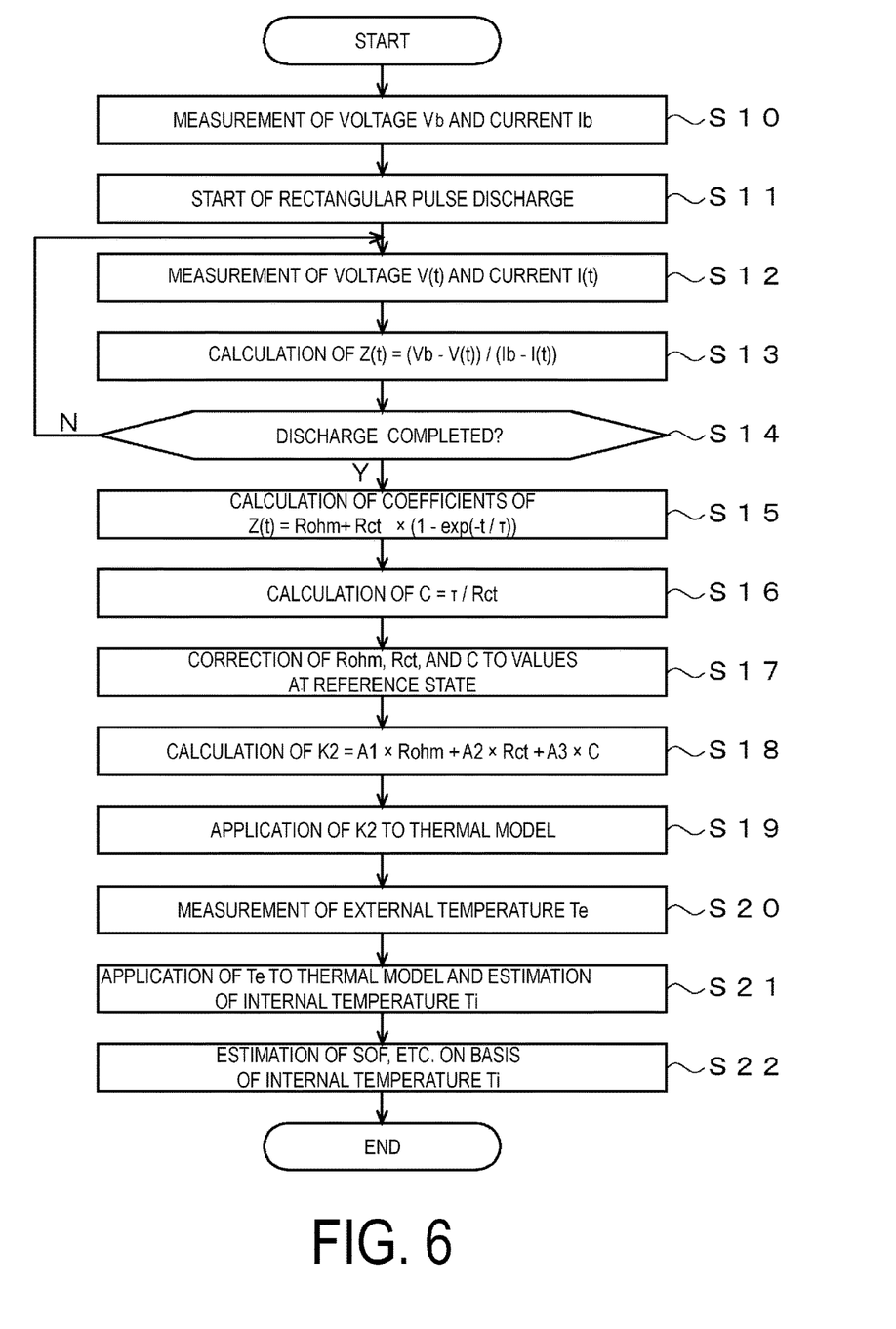
FIG. 6 is a flowchart for explaining details of the processing that is executed in the embodiment of the present invention.

Next, detailed operations of the embodiment of the present invention will be described while referring to FIG. 6. FIG. 6 is a flowchart for explaining an example of the processing executed in FIG. 1. This flowchart is executed when, for example, a new secondary battery 14 is installed in a vehicle (e.g. when a power-on reset is performed on the control unit 10). Once the flowchart shown in FIG. 6 starts, the following steps are executed.

In step S10, the CPU 10a measures the voltage Vb and the current Ib of the secondary battery 14 that is in a stable state prior to executing the discharging. Note that, the state can be determined to be stable in cases where, for example, the vehicle is stopped and the current flowing through the load 19 is less than a predetermined threshold value (e.g. a few amperes).

In step S11, the CPU 10a controls the discharge circuit 15 to discharge the secondary battery 14 in a rectangular pulse-like manner. Note that a width of the rectangular pulse can be set to, for example, a range of a few milliseconds to a few seconds. The discharging may be terminated upon a predetermined number of samplings having been executed or the element values of the equivalent circuit having been calculated, instead of using a preset width of the rectangular pulse.

In step S12, the CPU 10a measures the voltage and the current of the secondary battery 14 while referencing the output from the voltage sensor 11 and the current sensor 12, and stores these measured values as V(t) and I(t) in the RAM 10c as the parameters 10ca.

In step S13, the CPU 10a calculates Z(t) by substituting V(t) and I(t) measured in step S12 into the Equation (1) described above, and stores the resulting value in the RAM 10c as the parameter 10ca.

In step S14, the CPU 10a determines whether or not the discharging is completed. When it is determined that the discharging is completed (step S14: Yes), step S15 is executed; otherwise (step S14: No), step S12 is executed and the same processing as before is repeated. For example, when a predetermined period of time has passed, measurement has been executed a predetermined number of times, or the voltage or the current is stable (e.g. when transitioned from a transient state to a stationary state), the determination in step S14 is Yes and step S15 is executed.

In step S15, the CPU 10a acquires the Z(t) stored in the RAM 10c in step S13, applies the value to the Equation (2), and calculates the values of the Rohm, Rct, and $\tau$ using, for example, the least-square method or the like. As a result, values of the Rohm, Rct, and $\tau$ that best fit the change in the Z(t) in cases where the secondary battery 14 is discharged in a rectangular pulse, can be obtained.

In step S16, the CPU 10a substitutes the ti and the Rct calculated in step S15 into C=$\tau$/Rct and obtains a value for the electric double layer capacity C.

In step S17, the CPU 10a corrects the values of the element values Rohm, Rct, and C calculated in step S15 and step S16 to values at a reference state. The reference state is a state where the internal temperature of the secondary battery 14 is 25° C. and the SOC of the secondary battery 14 is 100%. The correction can be performed through a method in which, for example, a data table or correction formula is stored in advance in the ROM 10b and the correction is performed on the basis of this data table or correction formula. Note that in order to reduce correction errors when executing the correction of the temperature, it is preferable, for example, to use an output value from the temperature sensor 13 for which the stopping time of the vehicle is long (e.g. 12 hours or longer). Alternatively, an estimated value of the internal temperature Ti estimated using an initial value may be used.

In step S18, the CPU 10a substitutes the values of the coefficients A1 to A3 that are stored in the ROM 10b and the element values Rohm, Rct, and C corrected in step S17 into the Equation (3) and obtains a value of the integral gain K2. Note that the values of the coefficients A1 to A3 are not affected by the type of the secondary battery 14, the environment in which the secondary battery 14 is used, or the like and, therefore, for example, measured values stored beforehand in the ROM 10b may be used.

In step S19, the CPU 10a applies the integral gain K2 calculated in step S18 to the thermal model illustrated in FIG. 4. Note that the proportional gain K1 is not affected by the type of the secondary battery 14, the environment in which of the secondary battery 14 is used, or the like and, therefore, for example, measured values can stored beforehand in the ROM 10b.

In step S20, the CPU 10a references the output of the temperature sensor 13 and acquires the external temperature Te of the secondary battery 14.

In step S21, the CPU 10a substitutes the external temperature Te measured in step S20 into the thermal model illustrated in FIG. 4, and estimates the internal temperature Ti of the secondary battery 14. Note that the processing of step S20 and step S21 is preferably repeated for a set period of time in accordance with the time constant of the transfer function. That is, measurement over a set period of time is preferable because changes in the internal temperature Ti lag behind changes in the external temperature Te.

In step S22, the CPU 10a calculates the value of the SOF and the like that is temperature-dependent, on the basis of the internal temperature Ti of the secondary battery 14 calculated in step S21. Note that other values may be calculated as well.

As described above, according to the flowchart shown in FIG. 6, the integral gain K2 of the thermal model of the secondary battery 14 can be calculated using the element values of the equivalent circuit of the secondary battery 14. Additionally, with this integral gain K2, the internal temperature of the secondary battery 14 can be accurately calculated and, therefore, temperature-dependent status values (e.g. SOF) of the secondary battery 14 can be accurately calculated.

Additionally, by calculating the integral gain K2 from the equivalent circuit of the secondary battery 14, the internal temperature Ti can be accurately calculated, regardless of, for example, the size, initial capacity, type, or the like of the secondary battery 14.

(C) Explanation of Alternate Embodiments

It is needless to say that the embodiment described above is only an example and the present invention is not limited to the embodiment as described above. For example, in the embodiment described above, the equivalent circuit illustrated in FIG. 3 is used, but configurations are possible in which different equivalent circuits are used. Specifically, a configuration is possible in which an equivalent circuit is used that has two or more reaction resistances and electric double layer capacities. Note that in cases of using an equivalent circuit having two reaction resistances and electric double layer capacities, the two reaction resistances are referred to as Rtc1 and Rtc2 and the two electric double layer capacities are referred to as C1 and C2; and, in such a case, Equation (5) below is used in place of Equation (2).

$$Z(t)=\text{Rohm}+Rct1\times(1-\exp(-t/\tau1))+Rct2\times(1-\exp(-t/\tau2)) \quad (5)$$

Note that $\tau1$ and $\tau2$ are defined as follows:
$\tau1 = C1 \times Rct1$
$\tau2 = C2 \times Rct2$.

Additionally, Equation (6) below can be used in place of Equation (3).

$$K2 = A1 \times \text{Rohm} + A2 \times Rct1 + A3 \times C1 + A4 \times Rct2 + A5 \times C2 \quad (6)$$

Additionally, in the embodiment described above, only the element values of the equivalent circuit is included in Equation (3) for calculating the integral gain K2 but, for example, a configuration is possible in which an initial full charge capacity SOH_ini, which can be calculated from the element values, is used. More specifically, the initial full charge capacity SHO_ini can be calculated using Equation (7) below. Here, f1 (Rohm), f2 (Rct), and f4 (C) represent predetermined functions having Rohm, Rct, and C as variables.

$$SOH\_ini = B1 \times f1(\text{Rohm}) + B2 \times f2(Rct) + B3 \times f3(C) \quad (7)$$

The integral gain K2 can be obtained by using Equation (8) below that includes the SOH_ini calculated using Equation (7) above.

$$K2 = A0 \times SOH\_ini + A1 \times \text{Rohm} + A2 \times Rct + A3 \times C1 \quad (8)$$

Additionally, a configuration is possible in which an equation is used in which A0×SOH_ini is added to the right side of Equation (6) above.

Additionally, in the embodiment described above, all of the solution resistance Rohm, the reaction resistance Rct, and the electric double layer capacity C constituting the equivalent circuit are used, but configurations are possible in which one of these is used or a combination of any two of these are used.

Additionally, in the embodiment described above, an example of executing the processing shown in FIG. 6 for a case in which the secondary battery 14 is newly installed has been given but, for example, a configuration is possible in which the processing shown in FIG. 6 is re-executed at a predetermined interval, or in cases where errors in the values calculated using the internal temperature Ti increase or the like. For example, temperature characteristics change (e.g. specific heat declines due an increase of lead sulfate) due to the fact that the scientific characteristics of the electrode plates of the secondary battery 14 change due to degradation (e.g. lead sulfate increases due to sulfation). As such, in order to reproduce the characteristics that change with degradation, by executing the processing shown in FIG. 6 every one month for example, a thermal model reflecting the state of degradation can be constructed.

REFERENCE SIGNS LIST

1 Secondary battery internal temperature estimation device
10 Control unit (estimation means, calculation means, determination means, application means, and correction means)
10a CPU
10b ROM
10c RAM
10d Display
10e I/F
11 Voltage sensor
12 Current sensor
13 Temperature sensor
14 Secondary battery
15 Discharge circuit
16 Alternator
17 Engine
18 Starter motor
19 Load

The invention claimed is:

1. A device comprising:
a sensor for measuring an external temperature of a secondary battery of a vehicle;
a processor, wherein the processor is communicatively coupled to the sensor; and
a memory that stores executable instructions that, when executed by the processor, facilitate performance of operations, comprising:
estimating an internal temperature of the secondary battery of the vehicle on the basis of a relational equation showing a relationship between an external temperature of the secondary battery of the vehicle and an internal temperature of the secondary battery of the vehicle;
calculating element values of an equivalent circuit of the secondary battery, wherein the equivalent circuit of the secondary battery comprises at least a solution resistance and a reaction resistance;
determining coefficients of the relational equation on the basis of the element values of the equivalent circuit, wherein the determining the coefficients comprises determining, on the basis of one or more of the element values, a first coefficient of the relational equation applicable to the solution resistance and determining, on the basis of one or more of the element values, a second coefficient of the relational equation applicable to the reaction resistance; and
applying the coefficients obtained by the determining, wherein the estimating comprises estimating the internal temperature of the secondary battery on the basis of the relational equation to which the coefficients have been applied by the applying.

2. The device according to claim 1, wherein:
the determining the coefficients of the relational equation comprises determining the coefficients of the relational equation by referencing a dischargeable capacity of the secondary battery in a state of full charge.

3. The device according to claim 1, wherein the operations further comprise:
correcting the element values calculated by the calculating to reference values at a reference state of charge and at a reference temperature.

4. The device according to claim 1, wherein:
the estimating comprises estimating the internal temperature of the secondary battery by using a transfer function of a first-order lag system as the relational equation.

5. The device according to claim 4, wherein:
the determining comprises determining an integral gain of the transfer function of the first-order lag system on the basis of the element values of the equivalent circuit.

6. The device according to claim 1, wherein:
the calculating comprises calculating the element values of the equivalent circuit on the basis of a voltage and a current during discharge of the secondary battery.

7. The device according to claim 1, wherein:
the equivalent circuit of the secondary battery comprises the solution resistance, the reaction resistance, and an electric double layer capacity.

8. The device according to claim 7, wherein:
the determining the coefficients comprises determining a third coefficient of the relational equation applicable to the electric double layer capacity on the basis of one or more of the element values.

9. The device according to claim 7, wherein the estimating the internal temperature is performed according to equations (1) to (4), at least as follows:

$$Z(t)=(Vb-V(t))/(Ib-I(t)) \tag{1}$$

wherein t is a time, Z(t) is an impedance of the secondary battery at time t, Vb is a voltage of the secondary battery, V(t) is a sampled voltage of the secondary battery at time t, Ib is a current of the secondary battery, and I(t) is a sampled current of the secondary battery at time t, $$Z(t)=Rohm+Rct\times(1-\exp(-t/\tau)) \tag{2}$$

wherein Rohm is the solution resistance, wherein Rct is the reaction resistance, and wherein $\tau$ is a product of the electric double layer capacity and the reaction resistance, $$K2=A1\times Rohm+A2\times Rct+A3\times C \tag{3}$$

wherein K2 is an integral gain, wherein A1, A2 and A3 are the first coefficient, the second coefficient, and the third coefficient, respectively, and $$T(S)=Ti/Te=(K1+K2/S)/(1+K1+K2/S) \tag{4}$$

wherein T(S) is a transfer function with respect to object S, representing a ratio of the internal temperature Ti to the external temperature Te, and wherein K1 is a fourth coefficient for a type of the secondary battery.

10. The device according to claim 7, wherein:
the equivalent circuit of the secondary battery is an equivalent circuit model comprising at least two reaction resistances, including the reaction resistance, and at least two electric double layer capacities, including the electric double layer capacity.

11. The device according to claim 1, wherein the determining the coefficients comprises referencing a dischargeable capacity of the secondary battery in a state of full charge.

12. The device according to claim 1, further comprising:
a control unit, comprising the processor, that corrects the element values calculated by the control unit to reference values at a reference state of charge and at a reference temperature.

13. The device according to claim 12, wherein:
the control unit estimates the internal temperature of the secondary battery by using a transfer function of a first-order lag system as the relational equation, and wherein:
the control unit determines an integral gain of the transfer function of the first-order lag system on the basis of the element values of the equivalent circuit.

14. The device according to claim 12, wherein:
the control unit calculates the element values of the equivalent circuit on the basis of a voltage and a current during discharge of the secondary battery.

15. A secondary battery internal temperature estimation method for estimation of an internal temperature of a secondary battery of a vehicle, the method comprising:
estimating an internal temperature of the secondary battery of the vehicle on the basis of a relational equation showing a relationship between an external temperature and the internal temperature of the secondary battery, wherein the external temperature is measured by a sensor for measuring the external temperature that is attached to the secondary battery, and wherein the estimating is performed by a processor in communication with the sensor;
calculating, by the processor, element values of an equivalent circuit of the secondary battery, wherein the equivalent circuit of the secondary battery comprises a solution resistance, and a reaction resistance;
determining, by the processor, a first coefficient of the relational equation associated with the solution resistance on the basis of first values of the element values of the equivalent circuit calculated in the calculating;
determining, by the processor, a second coefficient of the relational equation associated with the reaction resistance on the basis of second values of the element values of the equivalent circuit calculated in the calculating; and
applying, by the processor, the first coefficient and the second coefficient to the relational equation, wherein the estimating comprises estimating the internal temperature of the secondary battery on the basis of the relational equation to which the first coefficient and the second coefficient have been applied by the applying.

16. The secondary battery internal temperature estimation method according to claim 15, wherein:
the equivalent circuit of the secondary battery comprises the solution resistance, the reaction resistance, and an electric double layer capacity.

17. The secondary battery internal temperature estimation method according to claim 16, further comprising:
determining a third coefficient of the relational equation associated with the electric double layer capacity on the basis of third values of the element values of the equivalent circuit calculated in the calculating, wherein the estimating comprises estimating the internal temperature of the secondary battery on the basis of the relational equation to which the first coefficient, the second coefficient, and the third coefficient have been applied by the applying.

18. A secondary battery internal temperature estimation method for estimation of an internal temperature of a secondary battery of a vehicle, the method comprising:
measuring, by a temperature sensor coupled to the secondary battery of the vehicle, an external temperature of the secondary battery of the vehicle;
estimating, by a processor coupled to the temperature sensor, an internal temperature of the secondary battery based on a relational equation showing a relationship between an external temperature and the internal temperature of the secondary battery;
calculating, by the processor, element values of an equivalent circuit of the secondary battery, wherein the equivalent circuit of the secondary battery comprises a solution resistance, a reaction resistance and an electric double layer capacity;
determining, by the processor, a first coefficient of the relational equation associated with the solution resistance based on first values of the element values of the equivalent circuit calculated in the calculating;
determining, by the processor, a second coefficient of the relational equation associated with the reaction resistance based on second values of the element values of the equivalent circuit calculated in the calculating;
determining, by the processor, a third coefficient of the relational equation associated with the electric double layer capacity based on third values of the element values of the equivalent circuit calculated in the calculating; and
applying, by the processor, the first coefficient, the second coefficient, and the third coefficient to the relational equation, wherein the estimating comprises estimating the internal temperature of the secondary battery based on the relational equation to which the first coefficient, the second coefficient, and the third coefficient have been applied by the applying.

19. The secondary battery internal temperature estimation method according to claim 18, wherein the reaction resistance comprises a first reaction resistance and a second reaction resistance, wherein the electric double layer capacity comprises a first electric double layer capacity and a second electric double layer capacity, and wherein estimating the internal temperature is performed according to at least equations (1), (5), (6) and (4), at least as follows:

$$Z(t)=(Vb-V(t))/(Ib-I(t)) \qquad (1),$$

wherein t is a time, $Z(t)$ is an impedance $Z(t)$ of the secondary battery at time t, Vb is a voltage of the secondary battery recorded by the processor, $V(t)$ is a sampled voltage of the secondary battery at time t recorded by the processor, Ib is a current of the secondary battery recorded by the processor, and $I(t)$ is a sampled current of the secondary battery at time t recorded by the processor, $$Z(t)=\text{Rohm}+Rct1\times(1-\exp(-t/\tau1))+Rct2\times(1-\exp(-t/\tau2)) \qquad (5),$$

wherein Rohm is the solution resistance, wherein Rct1 is the first reaction resistance, wherein Rct2 is the first reaction resistance, wherein τ1 is a first product of the first electric double layer capacity multiplied by the first reaction resistance, and wherein $\tau 2$ is a second product of the second electric double layer capacity multiplied by the second reaction resistance, $$K2=A1\times Rohm+A2\times Rct1+A3\times C1+A4\times Rct2+A5\times C2 \quad (6),$$

wherein K2 is an integral gain, wherein A1, A2 and A3 are the first coefficient, the second coefficient, and the third coefficient, respectively, wherein C1 is the first electric double layer capacity, and wherein C2 is the second electric double layer capacity, and $$T(S)=Ti/Te=(K1+K2/S)/(1+K1+K2/S) \quad (4),$$

wherein T(S) is a transfer function with respect to object S, representing a ratio of the internal temperature Ti to the external temperature Te, and wherein K1 is a fourth coefficient for a type of the secondary battery.

20. The secondary battery internal temperature estimation method according to claim 18, wherein estimating the internal temperature is performed according at least according to equations (1), (2), (7), (8) and (4), at least as follows:

$$Z(t)=(Vb-V(t))/(Ib-I(t)) \quad (1),$$

wherein t is a time, Z(t) is an impedance Z(t) of the secondary battery at time t recorded by the processor, Vb is a voltage of the secondary battery recorded by the processor, V(t) is a sampled voltage of the secondary battery at time t recorded by the processor, Ib is a current of the secondary battery recorded by the processor, and I(t) is a sampled current of the secondary battery at time t recorded by the processor, $$Z(t)=Rohm+Rct\times(1-\exp(-t/\tau)) \quad (2),$$

wherein Rohm is the solution resistance, wherein Rct is the reaction resistance, and wherein $\tau$=a product of the electric double layer capacity multiplied by the reaction resistance, $$SOH\_ini=B1\times f1(Rohm)+B2\times f2(Rct)+B3\times f3(C) \quad (7),$$

wherein SOH_ini is an initial full charge capacity, wherein f1(Rohm) is a first predetermined function of the solution resistance, wherein f2(Rct) is a second predetermined function of the reaction resistance, wherein C is the electric double layer capacity, wherein f3(C) is a third predetermined function of the electric double layer capacity, wherein B1, B2 and B3 are multipliers respectively applicable to f1(Rohm), f2(Rct) and f3(C), respectively, $$K2=A0\times SOH\_ini+A1\times Rohm+A2\times Rct+A3\times C \quad (8)$$

wherein K2 is an integral gain, wherein A1, A2 and A3 are the first coefficient, the second coefficient, and the third coefficient, respectively, wherein A0 is a fourth coefficient applicable to the initial full charge capacity, and $$T(S)=Ti/Te=(K1+K2/S)/(1+K1+K2/S) \quad (4),$$

wherein T(S) is a transfer function with respect to object S, representing a ratio of the internal temperature Ti to the external temperature Te, and wherein K1 is a fifth coefficient for a type of the secondary battery.

* * * * *